United States Patent
Katata et al.

(10) Patent No.: US 6,500,686 B2
(45) Date of Patent: Dec. 31, 2002

(54) HOT PLATE AND METHOD OF MANUFACTURING SEMICONDUCTOR DEVICE

(75) Inventors: Tomio Katata, Yokohama (JP); Junichi Wada, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/901,029

(22) Filed: Jul. 10, 2001

(65) Prior Publication Data

US 2002/0006680 A1 Jan. 17, 2002

(30) Foreign Application Priority Data

Jul. 10, 2000 (JP) ........................................ 2000-208355

(51) Int. Cl.[7] .............................................. H01L 21/00
(52) U.S. Cl. ............................................. 438/22; 438/5
(58) Field of Search .......................... 438/22, 622, 694, 438/725, 745, 778, 780, 781, 782, 5, 17, 26

(56) References Cited

U.S. PATENT DOCUMENTS 5,561,585 A * 10/1996 Barnes et al.
5,880,923 A * 3/1999 Hausmann
5,997,962 A   12/1999 Ogasawara et al. ......... 427/535

FOREIGN PATENT DOCUMENTS

| JP | 03180049 | * | 2/1993 |
| JP | 9-129716 |   | 5/1997 |
| JP | 10151516 A | * | 6/1998 |
| JP | 11037729 | * | 8/2000 |

* cited by examiner

*Primary Examiner*—David Nelms
*Assistant Examiner*—Phuc T. Dang
(74) *Attorney, Agent, or Firm*—Finnegan, Henderson, Farabow, Garrett & Dunner, L.L.P.

(57) ABSTRACT

In chucking a wafer to an electrostatic chuck type hot plate mounted in a semiconductor manufacturing apparatus, the chucking force is successively applied from the central portion toward the outer peripheral portion of the wafer. Therefore, the chuck electrode is divided in its radial direction into at least two electrode portions comprising an inner circumferential electrode portion and an outer circumferential electrode portion, and the chuck voltage is applied successively from the inner circumferential electrode portion toward the outer circumferential electrode portion. The chucking force is applied first to the central portion of the wafer so as to elevate the wafer temperature. In this step, the chucking force in the outer peripheral portion of the wafer is weak so as to permit the wafer to be thermally expanded smoothly. As a result, the stress within the wafer is low so as to prevent the wafer from being broken.

22 Claims, 9 Drawing Sheets

HOT PLATE AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2000-208355, filed Jul. 10, 2000, the entire contents of which are incorporated herein by reference.

BACKGROUND OF THE INVENTION

1. Field of the Invention

The present invention relates to a semiconductor device, particularly, to a hot plate for heating a semiconductor substrate or wafer held by an electrostatic chuck and a method of manufacturing a semiconductor device using the particular hot plate.

2. Description of the Related Art

In manufacturing a semiconductor device, a semiconductor circuit is formed by repeating the steps of forming an insulating film and a conductive film on a semiconductor substrate or wafer (hereinafter "wafer") such as a silicon substrate by a sputtering method, a CVD (Chemical Vapor Deposition) method, etc., and etching these films for the patterning purpose. Chemical reactions are utilized for the deposition and etching of the film, and the deposition rate and the etching rate are affected by the temperature. The quality of the deposited film is also affected by the temperature. It follows that it is important to control appropriately the temperature of the wafer under processing in order to carry out the processing stably with good reproducibility.

It is widely known to the art that the front surface or the back surface of a wafer is irradiated with light emitted from an infrared ray lamp for heating the wafer. In the case of using an infrared ray lamp, however, it is difficult to control accurately the temperature because the absorption efficiency of the infrared ray differs depending on the kind of the film formed on the wafer. What should also be noted is that, since the cooling cannot be achieved, the temperature tends to be excessively elevated during the processing.

Under the circumstances, a hot plate having a resistance heater arranged therein has come to be used widely. To be more specific, the particular hot plate is fixed to a stage equipped with a cooling mechanism, and a wafer is disposed on the hot plate. In this case, the wafer is heated or cooled by utilizing the heat conduction. The particular system includes the method that the wafer is tightly attached to the hot plate by utilizing the evacuation on the back surface of the wafer so as to fix the wafer, the method that the wafer is electrically fixed by utilizing the electrostatic attracting force, and the method that the wafer is mechanically pushed against the hot plate by utilizing a clamp or the like for fixing the wafer. Among these methods, it is impossible to employ under the vacuum the evacuation on the back surface. Also, in the case of utilizing the mechanical clamping force, the pushing member tends to cause the dust generation. Specifically, it is possible for a film to be attached to the pushing member. It is also possible for the pushing member to be brought into mechanical contact with the wafer. In this case, rubbing is brought about because a mechanical force is applied to the pushing member so as to generate dust.

In view of the above-noted problems inherent in the prior art, the method of allowing the wafer to be electrostatically held on a hot plate of an electrostatic chuck type is widely employed in recent years so as to carry out the heating and the cooling.

However, in the case of allowing the wafer of room temperature to be electrostatically held on the conventional electrostatic chuck type hot plate having a high temperature, serious problems are generated. For example, the wafer tends to be cracked. Also, it is difficult to dispose accurately the wafer on the hot plate.

Figure 17:
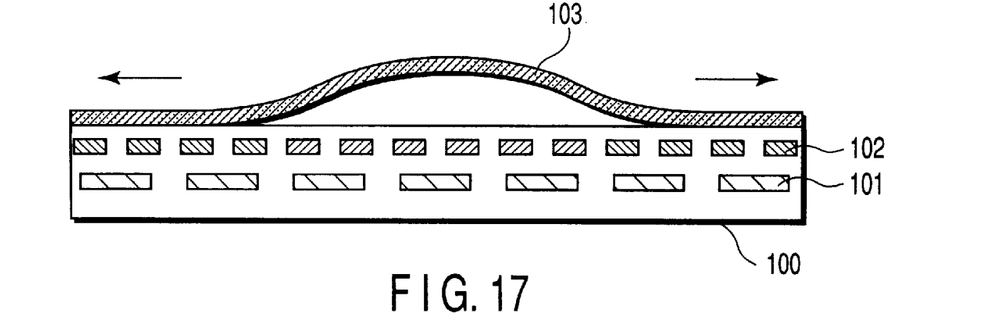
FIG. 17 is a cross sectional view showing the conventional electrostatic chuck type hot plate in the chucking step.
Figure 18:
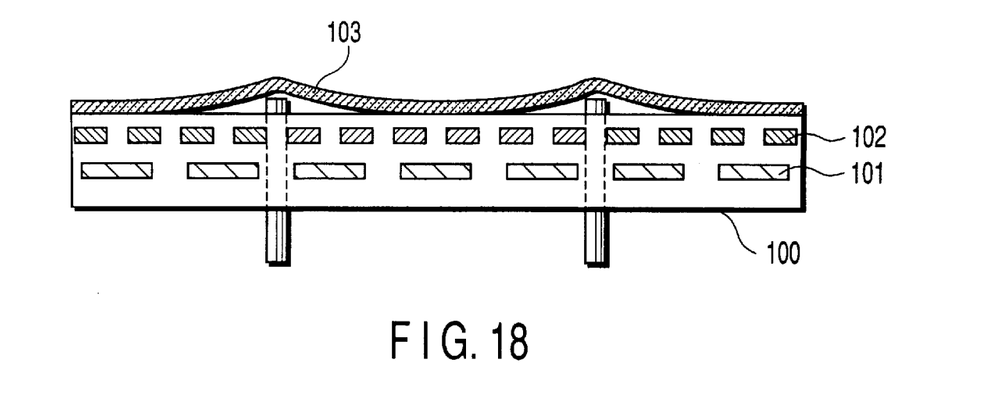
FIG. 18 is a cross sectional view showing the conventional electrostatic chuck type hot plate in the chuck-releasing step.

FIGS. 17 and 18 are cross sectional views each showing the conventional electrostatic chuck type hot plate. FIG. 17 shows the state in the chucking step, with FIG. 18 showing the state in the chuck-releasing step. The electrostatic chuck type hot plate comprises a plate body 100 formed of, for example, alumina. A heater electrode (heat generating electrode) 101 formed of, for example, a tungsten wire is arranged in substantially the central portion in the thickness direction of the plate body 100. Also, an electro-static chuck electrode 102 is arranged in a region close to the surface of the plate body 100 on which a wafer 103 is disposed.

Where the wafer 103 of room temperature is disposed and chucked on the hot pate having a high temperature, the wafer 103 is thermally expanded in accordance with the temperature elevation. However, since the wafer 103 is fixed to the entire surface of the plate body 100 by the electrostatic chucking force, the wafer 103 fails to be expanded sufficiently as shown in FIG. 17, with the result that the wafer 103 is finally cracked by the compression stress. Particularly, if the hot plate has a high temperature, the wafer 103 is much expanded thermally so as to promote the cracking of the wafer 103.

As described above, the wafer 103 is cracked by the compression stress in the case where the wafer 103 of room temperature is chucked on the conventional electrostatic chuck plate having a high temperature. Also, dust is generated by the rubbing, and the transfer error is generated by the deviation of the wafer 103. What should also be noted is that the electrostatic chucking force is changed depending on the kind of the film formed on the back surface of the wafer, with the result that the frequency of the crack occurrence differs depending on the kind of the film formed on the back surface of the wafer 103.

Further, the degree of discharge in the chuck releasing step also differs depending on the kind of the film formed on the wafer. Therefore, the wafer releasing process continues to operate even if the chucking force is not eliminated completely, thereby bringing about a transfer deviation (jumping) as shown in FIG. 18. In order to overcome the difficulty, the wafer is held on the hot plate before application of the chuck voltage and, after heated to some extent to permit the thermal expansion, the wafer is chucked on the hot plate. Alternatively, the chuck-releasing time is set long. However, these methods give rise to the problem that the through-put is markedly lowered. Also, where it is necessary to start the film formation during the temperature elevation of the wafer as in the Al reflow process, the Al filling properties are deteriorated so as to lower the yield.

BRIEF SUMMARY OF THE INVENTION

According to a first aspect of the present invention, there is provided a hot plate comprising: a plate body having a convex surface on which a semiconductor substrate is disposed; a heat generating electrode formed within the plate body; and an electrostatic chuck electrode formed in the plate body, wherein a distance between the semiconductor substrate and the convex surface of the plate body is increased from a central portion toward an outer peripheral portion of the plate body, when the semiconductor substrate is disposed on the convex surface of the plate body.

According to a second aspect of the present invention, there is further provided a hot plate comprising: a plate body having a substantially flat surface on which a semiconductor substrate is disposed; a heat generating electrode formed within the plate body; and an electrostatic chuck electrode formed in the plate body in a convex scheme over the range from one outer peripheral portion to the opposite outer peripheral portion of the plate body via the central portion.

According to a third aspect of the present invention, there is further provided a method of manufacturing a semiconductor device, comprising: disposing a semiconductor substrate on a hot plate including a plate body, a heat generating electrode formed in the plate body and configured to heat the semiconductor substrate disposed on the hot plate, and an electrostatic chuck electrode formed in the plate body and divided into a plurality of electrode portions over the range from one outer peripheral portion to the opposite outer peripheral portion of the plate body via the central portion to include an inner circumferential electrode portion and an outer circumferential electrode; holding the semiconductor substrate on the hot plate by a chucking force generated by applying a chuck voltage to the electrostatic chuck electrode successively from the inner circumferential electrode portion toward the outer circumferential electrode portion to generate the chucking force successively from the inner circumferential electrode portion toward the outer circumferential electrode portion temperature; and processing the semiconductor substrate heated on the hot plate.

According to a fourth aspect of the present invention, there is further provided a method of manufacturing a semiconductor device, comprising: disposing a semiconductor substrate on a hot plate including a plate body, a heat generating electrode formed in the plate body and configured to heat the semiconductor substrate disposed on the hot plate, and an electrostatic chuck electrode formed in the plate body; holding the semiconductor substrate on the hot plate by a chucking force generated by applying a chuck voltage to the electrostatic chuck electrode; processing the semiconductor substrate heated on the hot plate; releasing the semiconductor substrate from the hot plate by applying a chuck-releasing voltage of an opposite polarity to that of the chuck voltage to the electrostatic chuck electrode; and controlling at least one of the chuck voltage, a chucking time, the chuck-releasing voltage, and a chuck-releasing time based on a detected information obtained by detecting a back surface state of the semiconductor substrate before or after disposing the semiconductor substrate on the plate body.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Some embodiments of the present invention will now be described with reference to the accompanying drawings.

Figure 1A:
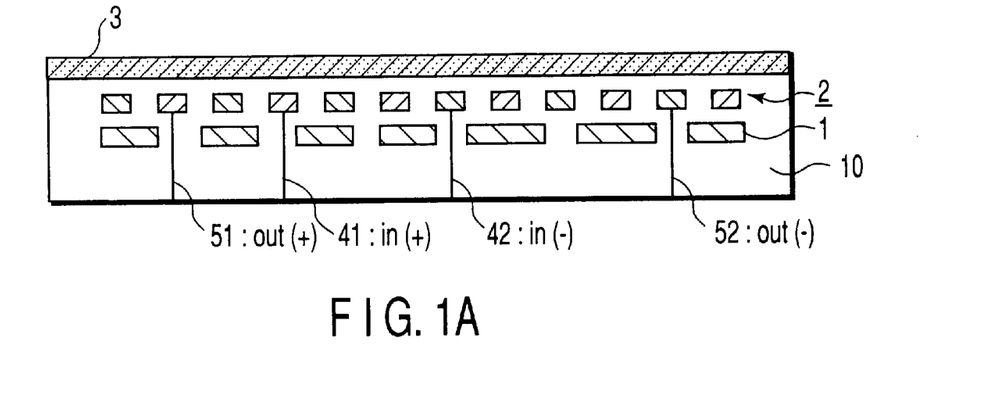
FIG. 1A is a cross sectional view showing an electrostatic chuck type hot plate according to one embodiment of the present invention, on which a semiconductor substrate (wafer) is mounted.
Figure 1B:
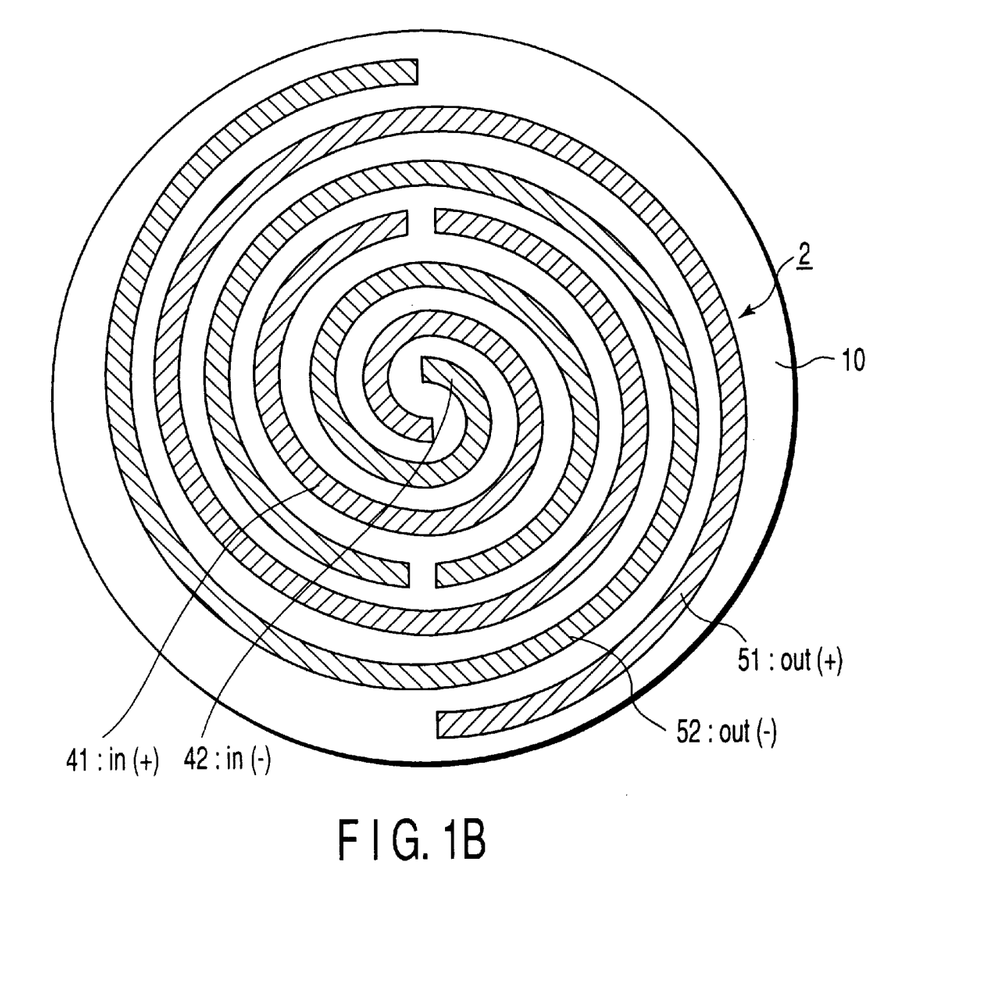
FIG. 1B is a plan view showing an electrostatic chuck electrode formed in the hot plate according to the first embodiment of the present invention.
Figure 2A:
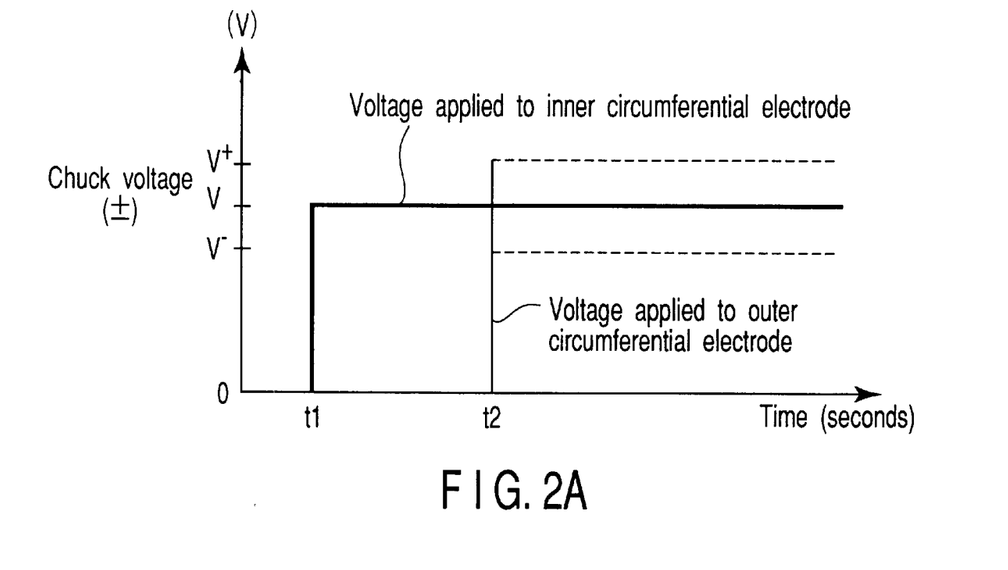
FIG. 2A is a graph showing the change with time in the chuck voltage applied to the chucking electrode between the time when a chuck voltage is applied to the chucking electrode and the time when the wafer is chucked according to the first embodiment of the present invention.
Figure 2B:
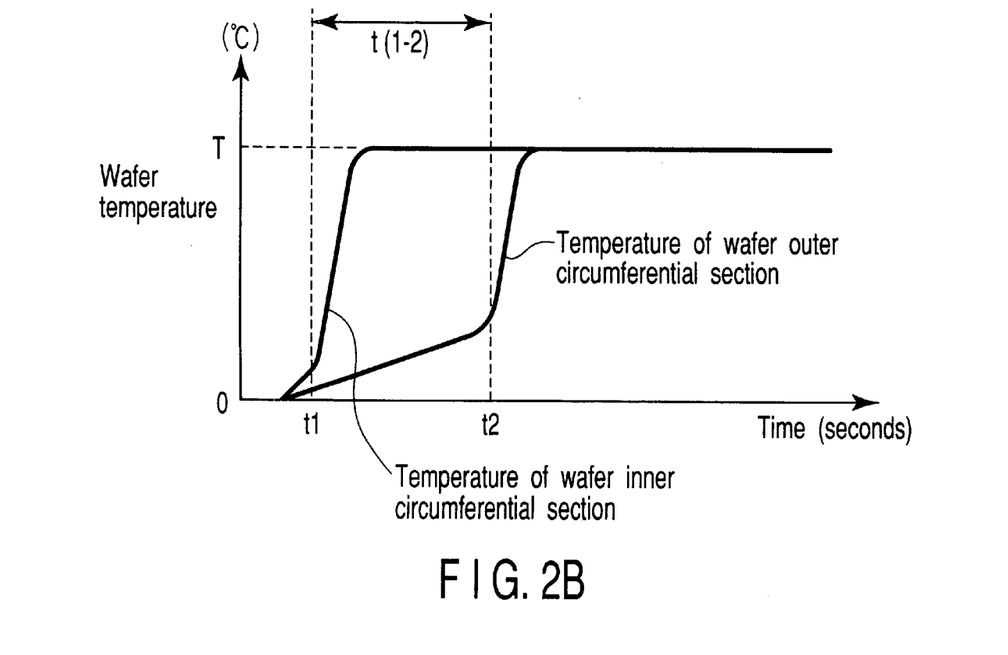
FIG. 2B is a graph showing the change with time in the wafer temperature according to the first embodiment of the present invention.
Figure 3:
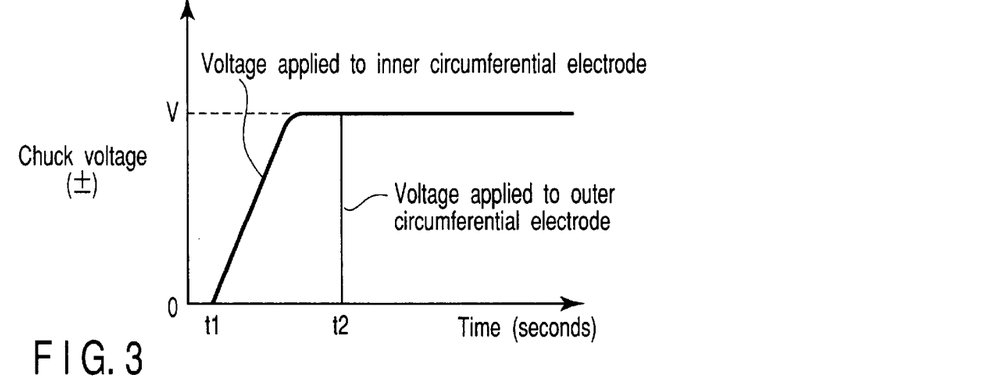
FIG. 3 is a graph showing the change with time in the chuck voltage between the time when the chuck voltage is applied to the chucking electrode and the time when the wafer is chucked according to the first embodiment of the present invention.

FIGS. 1 to 4 collectively show a first embodiment of the present invention. Specifically, FIG. 1A is a cross sectional view showing an electrostatic chuck type hot plate having a wafer mounted thereon, and FIG. 1B is a plan view schematically showing an electrostatic chuck electrode formed in the hot plate shown in FIG. 1A. Each of FIGS. 2A and 4A is a graph showing the change with time in the chuck voltage applied to the chuck electrode between the time when a chuck voltage is applied to the chuck electrode and the time when the wafer is chucked according to the first embodiment of the present invention. Each of FIGS. 2A and 4A also shows the chuck voltage after the wafer has been chucked. Each of FIGS. 2B and 4B is a graph showing the change with time in the wafer temperature until the wafer is chucked according to the first embodiment of the present invention. Each of FIGS. 2B and 4B also shows the wafer temperature after the wafer has been chucked. FIG. 3 is a graph showing the change with time in the chuck voltage between the time when the chuck voltage is applied to the chuck electrode and the time when the wafer is chucked according to the first embodiment of the present invention. FIG. 3 also shows the chuck voltage after the wafer has been chucked.

The electrostatic chuck type hot plate according to the first embodiment of the present invention is arranged within a process apparatus and comprises a plate body 10 made of a ceramic material such as alumina ($Al_2O_3$). A heater electrode (heat generating electrode) 1, which is arranged in substantially the central portion in the thickness direction of the plate body 10, is formed of an electrode material such as a tungsten wire. Also, an electrostatic chuck electrode 2 is arranged within the plate body 10 in a region near the surface on which a wafer 3 is to be disposed. In this embodiment, the electrostatic chuck electrode 2 comprises a pair of electrodes arranged in parallel in a spiral form, surrounding the central portion of the plate body 10. One of the electrodes is divided into two portions constructed by an inner circumferential electrode portion 41 in the inner circumferential section and an outer circumferential electrode portion 51 in the outer circumferential section. Similarly, the other electrode is divided into two portions constructed by an inner circumferential electrode portion 42 in the inner circumferential section and an outer circumferential electrode portion 52 in the outer circumferential section. The electrode portion 41 is for applying a positive voltage and the electrode portion 42 is for applying a negative voltage in the chucking step. On the other hand, the electrode portion 51 is for applying a positive voltage and the electrode portion 52 is for applying a negative voltage in the chucking step. These electrode portions are connected to a power source (not shown).

How to heat a semiconductor substrate (wafer) by using the electrostatic chuck type hot plate described above will now be described. It should be noted that the plate body 10 constituting the hot plate is heated by the heater electrode 1 to temperature T required for processing the wafer 3, i.e., the film forming process such as the sputtering and CVD and the etching treatment such as RIE (Reactive Ion Etching). The wafer 3 such as a silicon wafer is transferred so as to be disposed on the plate body 10 heated to temperature T.

In the first step, predetermined positive and negative voltages V are applied to the inner circumferential electrode 41 and the inner circumferential electrode 42 at time t1. As a result, the heating of the wafer 3 is started so as to thermally expand the wafer 3. In this step, the outer circumferential portion of the wafer 3 is not chucked and, thus, the wafer 3 is expanded in the outer circumferential direction and, thus, a compressive stress is not generated.

Then, predetermined positive and negative voltages are applied to the outer circumferential electrode 51 and the outer circumferential electrode 52 at time t2, which is time t later. In this step, the outer circumferential section of the wafer 3 is also chucked such that the entire region of the wafer 3 is chucked to the hot plate, with the result that the wafer temperature is rendered uniformly equal to temperature T of the hot plate. FIG. 2A is a graph showing the change with time in the chuck voltage, with FIG. 2B showing the change with time in the wafer temperature. The chuck voltage (±V) is plotted on the ordinate of the graph of FIG. 2A, with the time (seconds) for applying the chuck voltage being plotted on the abscissa. Further, the wafer temperature (° C.) is plotted on the ordinate of the graph shown in FIG. 2B, with the time (seconds) for applying voltage to the chuck being plotted on the abscissa.

In this embodiment, voltage V is applied to the inner circumferential electrode portions at time t1 and voltage V is applied to the outer circumferential electrode portions at time t2. Alternatively, it is also possible to apply the voltage $V^+$ or $V^-$ to the outer circumferential electrode portions at time t2, which is higher or lower than the voltage V applied to the inner circumferential electrode portions at time t1. It is possible to gradually increase the chuck voltage to a predetermined voltage. FIG. 3 is a graph showing the change with time in the chuck voltage. The chuck voltage (±V) is plotted on the ordinate of the graph, with the time (seconds) for applying voltage to the chuck being plotted on the abscissa. FIG. 3 shows that the voltage applied to the inner circumferential electrode portions at time t1 is gradually increased to a predetermined voltage V. On the other hand, the predetermined voltage V is instantly applied at time t2 to the outer circumferential electrode portions. However, it is also possible to increase gradually the voltage applied to the outer circumferential electrode portions. If the voltage applied to the electrodes is gradually increased, it is possible to decrease the compressive stress derived from the thermal expansion caused by the rapid temperature elevation of the wafer.

As described above, in the embodiment, the central portion of the wafer is chucked first so as to prevent the wafer from being rubbed strongly on the hot plate. As a result, it is possible to prevent the particle generation. It is also possible to prevent the compressive stress from being generated in the wafer so as to prevent the wafer from being broken. It follows that it is possible to improve the reliability of the semiconductor manufacturing apparatus.

Figure 4A:
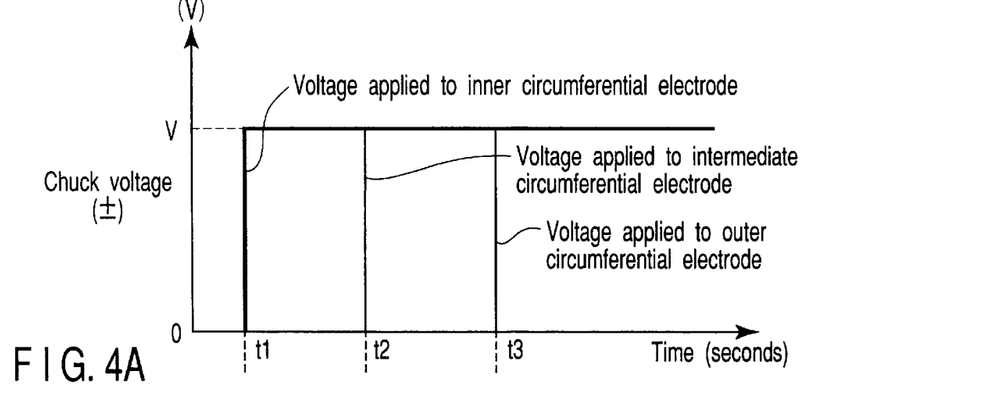
FIG. 4A is a graph showing the change with time in the chuck voltage applied to the chucking electrode between the time when a chuck voltage is applied to the chucking electrode and the time when the wafer is chucked according to the first embodiment of the present invention.
Figure 4B:
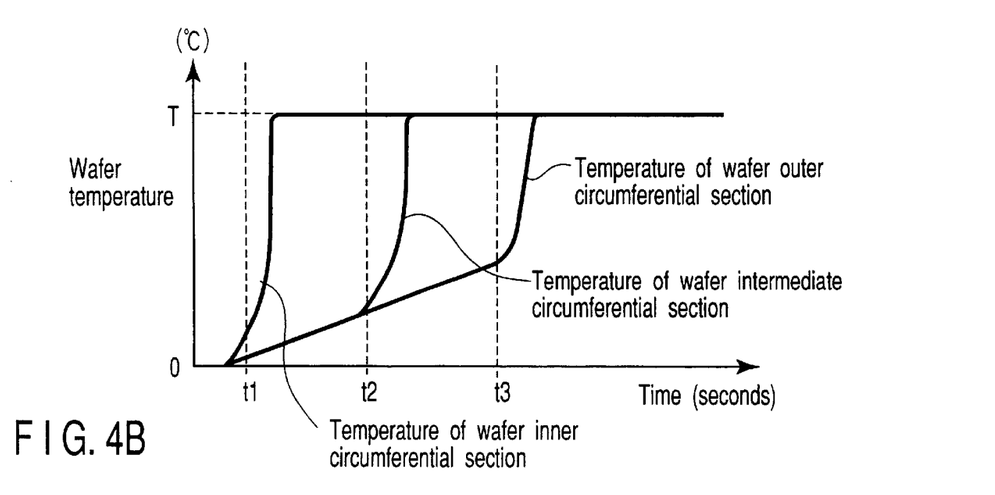
FIG. 4B is a graph showing the change with time in the wafer temperature according to the first embodiment of the present invention.

Also, in the embodiment described above, the electrostatic chuck electrode is divided into two portions. Alternatively, it is also possible to divide the electrostatic chuck electrode into three or more portions. FIGS. 4A and 4B are graphs showing the change with time in the chuck voltage and the change with time in the wafer temperature, covering the case where the electrostatic chuck electrode is divided into three portions. The chuck voltage (±V) is plotted on the ordinate of the graph of FIG. 4A, with the time (seconds) for applying voltage to the chuck electrode being plotted on the abscissa. On the other hand, the wafer temperature (° C.) is plotted on the ordinate of the graph of FIG. 4B, with the time (seconds) for applying voltage to the chuck electrode being plotted on the abscissa. Since the central portion of the wafer is chucked first, it is possible to prevent the wafer from being rubbed strongly on the hot plate in this case, too. As a result, it is possible to prevent the particle generation. It is also possible to prevent the compressive stress from being generated in the wafer so as to prevent the wafer from being broken. The effect of suppressing the wafer breakage can be further improved in this case, compared with the case where the electrostatic chuck electrode is divided into two portions.

Figure 5:
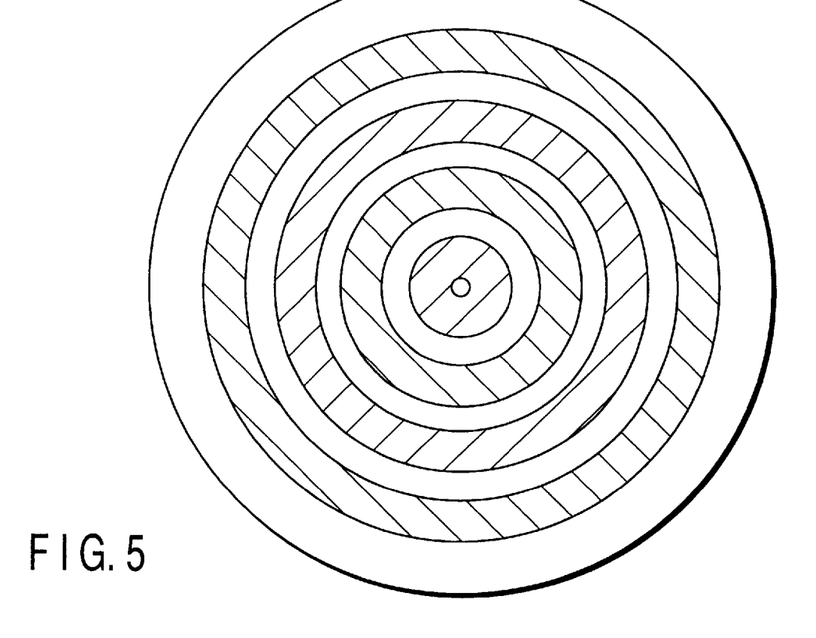
FIG. 5 is a plan view showing another example of the electrostatic chuck electrode formed in the hot plate according to the first embodiment of the present invention.
Figure 6:
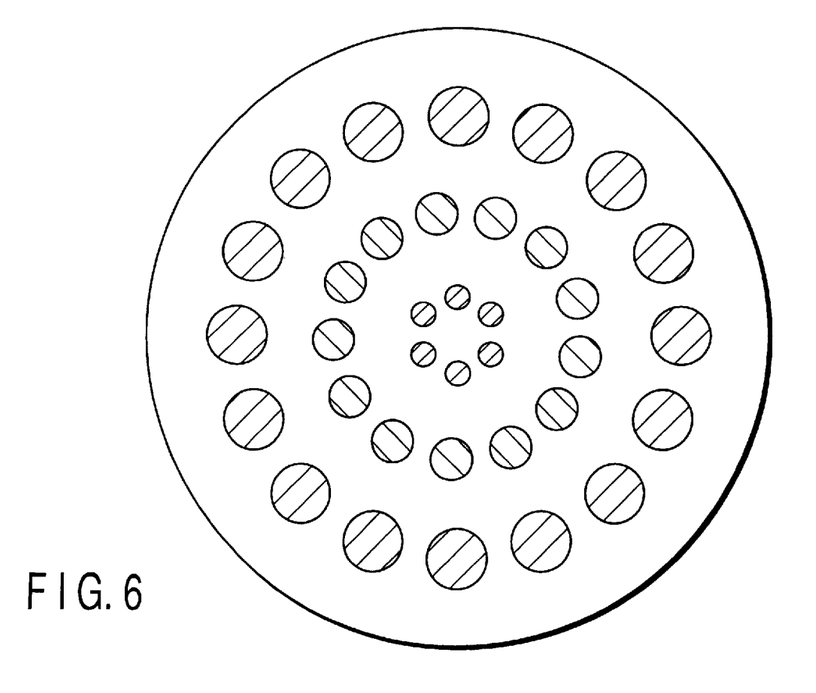
FIG. 6 is a plan view showing a further example of the electrostatic chuck electrode formed in the hot plate according to the first embodiment of the present invention.
Figure 7:
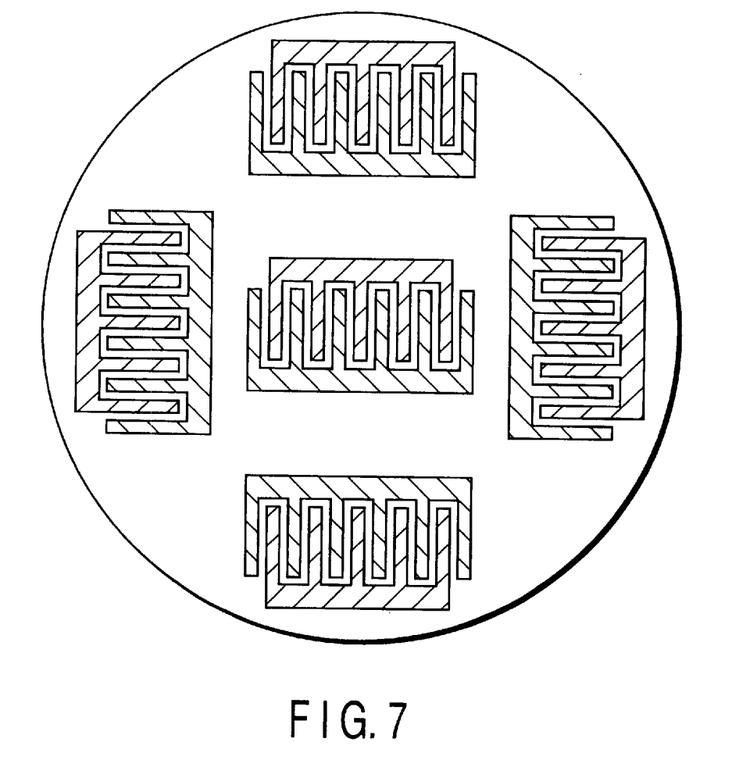
FIG. 7 is a plan view showing a further example of the electrostatic chuck electrode formed in the hot plate according to the first embodiment of the present invention.

In this embodiment, the electrostatic chuck electrode 2 comprises a pair of electrodes arranged in parallel in a spiral form, each of the electrodes being divided into two portions consisting of an inner circumferential electrode portion and an outer circumferential electrode portion. Alternatively, it is possible to provide an electrostatic chuck electrode comprising ring-shape electrodes (hatched portions) arranged in a concentric circle form, surrounding the central portion of the plate body, as shown in FIG. 5. It is also possible to provide an electrostatic chuck electrode comprising circle-shape electrodes (hatched portions) arranged to form concentric circles surrounding the central portion of the plate body, as shown in FIG. 6. These circle-shape chuck electrodes are of single pole structure and thus a single polarity voltage, i.e. a positive voltage or a negative voltage, is applied to the electrodes, unlike the dipole type chuck electrodes shown in FIGS. 1A and 1B in which a positive voltage and a negative voltage are applied to the electrodes. It is also possible to provide an electrostatic chuck electrode comprising combined comb-shape electrodes (hatched portions). each comprising a pair of comb-shape patterns interlaced with each other, one of the comb-shape electrodes being arranged in the central portion of the hot plate body and the other comb-shape electrodes surrounding the central portion of the plate body, as shown in FIG. 7. Some other shapes of the electrode portions may be provided.

A second embodiment of the present invention will now be described with reference to FIG. 8.

Figure 8:
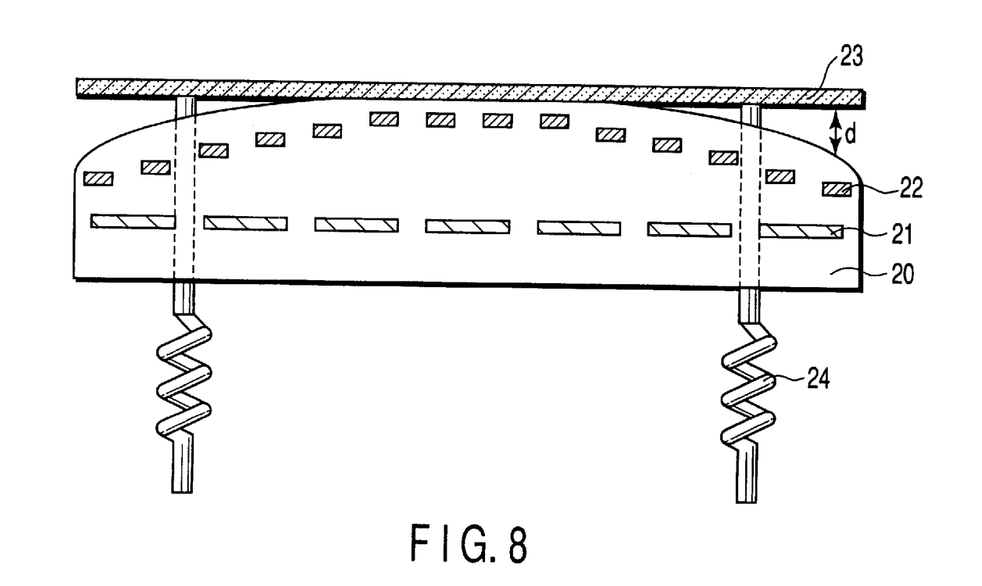
FIG. 8 is a cross sectional view showing an electrostatic chuck type hot plate according to a second embodiment of the present invention.

FIG. 8 is a cross sectional view showing an electrostatic chuck type hot plate according to the second embodiment of the present invention. The electrostatic chuck type hot plate according to the second embodiment of the present invention is arranged within a processing apparatus and comprises plate body 20 made of a ceramic material such as alumina (Al$_2$O$_3$). A heater electrode (heat generating electrode) 21, which is arranged in substantially the central portion in the thickness direction of the plate body 20, is formed of an electrode material such as a tungsten wire. On the other hand, an electrostatic chuck electrode 22 is arranged within the plate body 20 in a region close to the surface on which a wafer 23 is disposed. In the second embodiment, the surface of the plate body 20 for supporting the wafer 23 is downwardly curved from the central portion toward the outer peripheral portion. In other words, the plate body 20 has a convex cross sectional shape. Also, the electrostatic chuck electrode 22 has a convex scheme over the range from one outer peripheral portion to the opposite outer peripheral portion of the plate body 22 via the central portion. Since the surface of the plate body 20 is downwardly curved from the central portion toward the outer peripheral portion, the distance d immediately before the chucking between the upper surface of the plate body 22 and the wafer 23 is smaller in the central portion of the plate body 20 than in the outer peripheral portion. Also, a plurality of through-holes (not shown) are formed in the plate body 20, and lifter pins 24 for transferring the wafer are inserted into these through-holes. The lifter pins 24 are moved up and down in transferring the wafer and are allowed to act also as a wafer sensor.

According to the second embodiment of the present invention, the chucking surface is curved downward from the central portion toward the outer peripheral portion and the electrostatic chuck electrode has a convex cross sectional shape. It follows that the central portion alone of the wafer in contact with the chucking surface is chucked at the start-up time of the chucking of the wafer and, then, the outer peripheral portion of the wafer is gradually chucked. It follows that, as in the first embodiment described previously, it is possible to suppress the particle generation derived from the breakage or rubbing of the wafer caused by the compressive stress generated within the wafer. It should also be noted that, since the electrostatic chuck electrode need not be divided, the chuck power source is simplified so as to achieve the cost reduction. Further, the wafer lifter pin serves to hold the wafer horizontal and apply a uniform chucking force to the wafer. What should also be noted is that the wafer lifter pin, which also acts as a sensor provided with a spring, is capable of detecting the defect when the normal wafer delivery was not performed because of the breakage or an erroneous transfer of the wafer. It is desirable for the distance d between the upper surface of the electrostatic chuck immediately before the chucking and the lower surface of the wafer 23 to fall within a range of between about 100 μm and 1 mm in the outer peripheral portion. If the distance d noted above is smaller than 100 μm, a time lag is not generated adequately between the time when the chucking force is applied to the inner surface of the wafer and the time when the chucking force is applied to the outer surface of the wafer, resulting in failure to suppress the stress generated in the wafer sufficiently. On the other hand, if the distance d is larger than 1 mm, the wafer is excessively distorted so as to increase the stress generated in the wafer, with the result that the wafer cannot be chucked sufficiently in many cases.

Figure 9:
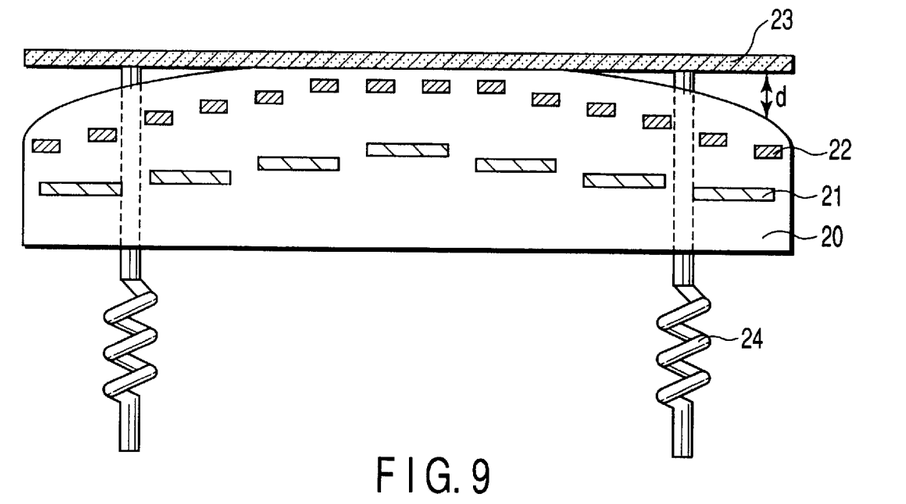
FIG. 9 is a cross sectional view showing another example of the electrostatic chuck type hot plate according to the second embodiment of the present invention.
Figure 16:
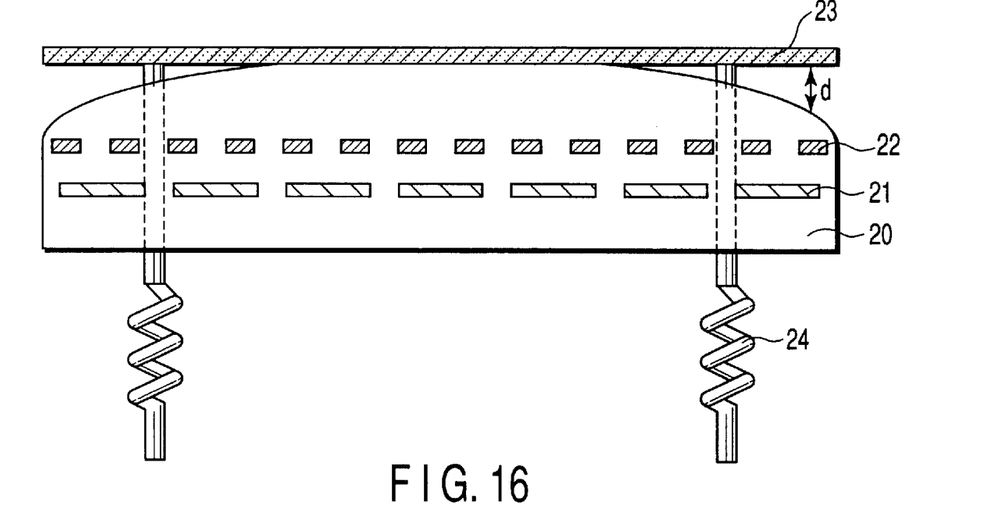
FIG. 16 is a cross sectional view showing a further example of the electrostatic chuck type hot plate according to the second embodiment of the present invention shown in FIG. 8.

In the embodiment described above, the heater electrode 21 are provided in the same height in the hot plate body over the range from the central portion to the outer peripheral portion. Alternatively, it is possible to provide a heater electrode 21 having a convex scheme over the range from one outer peripheral portion to the opposite outer peripheral portion of the plate body 20 via the central portion, as shown in FIG. 9. Furthermore, in the embodiment described above, the electrostatic chuck electrode 22 has a convex cross sectional shape. Alternatively, it is possible to provide a plate body 20 having an electrostatic chuck electrode having a flat scheme. That is, it is possible to provide a plate body 20 having an electrostatic chuck electrode in the same height in the plate body 20 over the range from one outer peripheral portion to the opposite outer peripheral portion of the plate body 20 via the central portion, as shown in FIG. 16.

Figure 10:
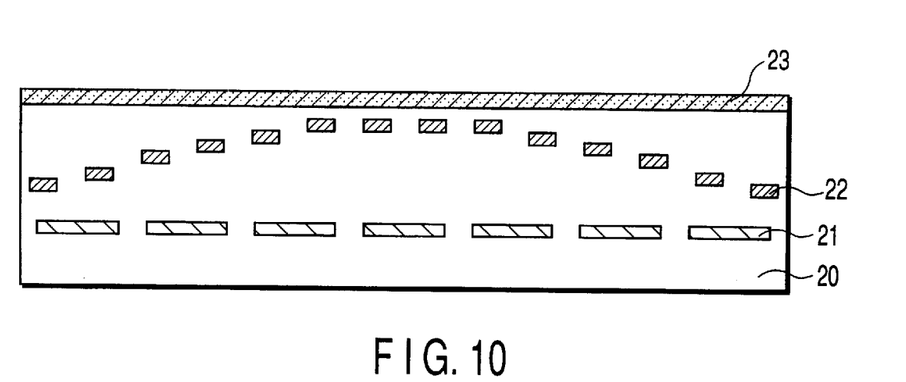
FIG. 10 is a cross sectional view showing a further example of the electrostatic chuck type hot plate according to the second embodiment of the present invention.
Figure 11:
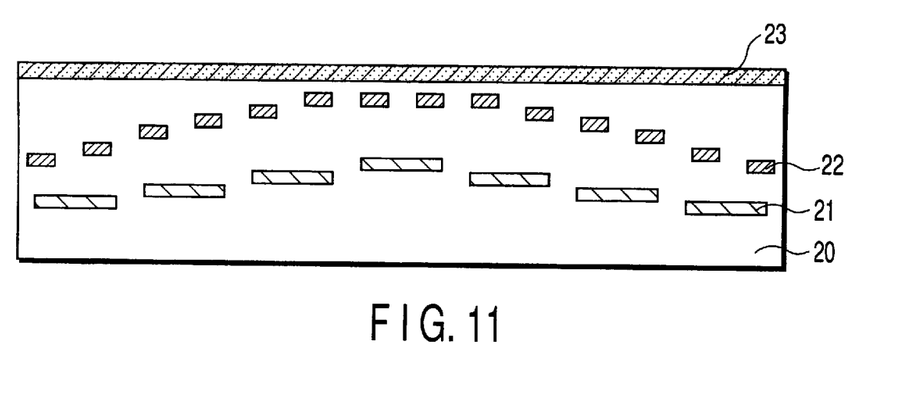
FIG. 11 is a cross sectional view showing a further example of the electrostatic chuck type hot plate according to the second embodiment of the present invention.

In the embodiment described above, the surface of the plate body 20 for supporting the wafer 23 has a convex cross sectional shape. Alternatively, it is possible to provide a plate body 20 having a surface of a flat cross sectional shape for supporting a wafer, as shown in FIG. 10. It is also possible to provide a plate body 20 having a surface of a flat cross sectional shape for supporting a wafer, and also having a heater electrode 21 having a convex scheme over the range from one outer peripheral portion to the opposite outer peripheral portion of the plate body 20 via the central portion, as shown in FIG. 11.

Figure 12:
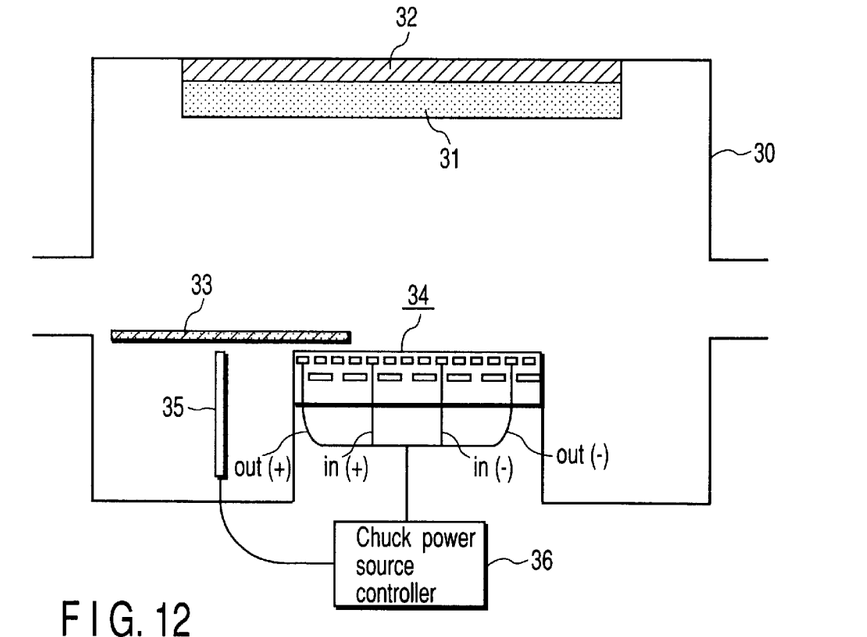
FIG. 12 is a cross sectional view schematically showing a semiconductor manufacturing apparatus (sputtering apparatus) in which a hot plate is arranged, according to a third embodiment of the present invention.
Figure 13:
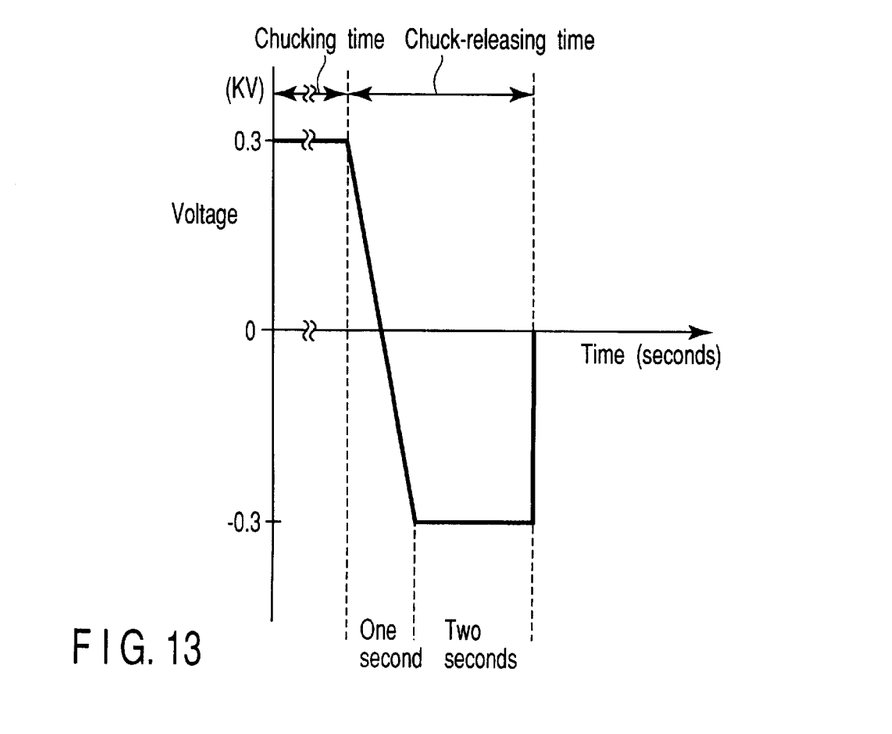
FIG. 13 is a graph showing the change with time in the chuck-releasing voltage in the chuck-releasing step in the third embodiment of the present invention.

Further embodiments of the present invention will now be described with reference to FIGS. 12 and 15. Specifically, FIG. 12 is a cross sectional view schematically showing the construction of a semiconductor manufacturing apparatus (sputtering apparatus) in which is arranged a hot plate 34. FIG. 13 is a graph showing the change with time in the chuck-releasing voltage in the chuck-releasing time. In the hot plate 34 according to the third embodiment of the present invention, the electrostatic chuck electrode is divided into two electrode portions, and the surface of the plate body on which the wafer is disposed is formed flat as in the first embodiment described previously. The sputtering apparatus comprises a sputter chamber 30, which is provided with a sputtering gas introducing port for introducing a sputtering gas such as an Ar gas into the sputter chamber 30. The sputter chamber 30 is also provided with a vacuum exhaust port connected to a vacuum pump (not shown) and, thus, the sputter chamber 30 can be exhausted to set up a vacuum state. Arranged within the sputter chamber 30 exhausted to set up a vacuum state are a cathode 32 holding a target 31 and the hot plate 34 positioned to face the cathode 32. A back surface monitor probe 35 for detecting the state of the back surface of a wafer 33 is arranged on the side of the stage on which the hot plate 34 is arranged. The hot plate 34 is heated to 450° C. As in the embodiment shown in FIG. 1, the electrostatic chuck electrode of the hot plate 34 is divided into two portions, i.e., into the inner circumferential electrode portion and the outer circumferential electrode portion. The inner circumferential electrode portion includes a first electrode portion for applying a positive voltage and a second electrode portion for applying a negative voltage in the chucking step. Likewise, the outer circumferential electrode portion includes a first electrode portion for applying a positive voltage and a second electrode portion for applying a negative voltage in the chucking state. These electrodes are connected to a chucking power source controller 36.

Before the wafer 33 is transferred so as to be disposed on the hot plate 34, the back surface state of the wafer 33 is monitored by the back surface monitor probe 35. The monitored information is supplied to the chuck power source controller 36 and, at the same time, the wafer 33 is disposed on the hot plate 34. Then, the chuck voltage applying parameter determined in advance on the basis of the back surface state is selected, and the inside chuck voltage and the outside chuck voltage are applied in the order mentioned. As a result, the wafer is chucked from the central portion of the wafer, and the wafer is heated to 450° C.

The method according to the third embodiment of the present invention makes it possible to prevent the wafer and the hot plate to be strongly rubbed each other so as to bring about the particle generation and to prevent the compressive stress from being generated within the wafer. It follows that the wafer is prevented from being broken.

In the next step, a sputtering gas is introduced into the sputter chamber 30. When a predetermined sputtering gas pressure has been set up within the sputter chamber 30, a DC power is applied to the target 31 for a predetermined time, thereby finishing the film forming operation. Then, the discharge process is performed on the basis of the chuck-releasing parameter determined in advance based on the back surface state so as to transfer the wafer 33 out of the sputter chamber 30, thereby finishing a series of the sputter film forming process. The back surface monitor probe 35 serves to determine the electrostatic chuck parameter. It is also possible to use the back surface monitor probe 35 together with an emissivity measuring probe for calibrating the temperature of an infrared emissivity thermometer. In the third embodiment shown in FIG. 12, the back surface monitor probe 35 is arranged within the sputter chamber 30. Alternatively, it is also possible to arrange the back surface monitor probe 35 in another chamber such as a load lock chamber. A conventional hot plate may be used in place of the hot plate 32. Even in use of a conventional hot plate, by detecting the back surface state of the wafer 33 by the back surface monitor probe and controlling the parameters such as the chuck voltage, the chucking time, etc. the wafer is prevented from cracking, transfer error, etc.

In the discharge process, voltage in a direction opposite to that in the chucking step is applied to the electrostatic chuck electrode. As shown in FIG. 13, applied to the electrode is the same voltage, which is opposite in polarity to that in the chucking step, for a short time (about 2 seconds). For example, voltage of −0.3 kV is applied to the electrode to which was applied voltage of +0.3 kV, and voltage of +0.3 kV is applied to the electrode to which was applied voltage of −0.3 kV. In the graph of FIG. 13, the chuck voltage and the chuck-releasing voltage (V) is plotted on the ordinate, with the chucking time and the chuck-releasing time (seconds) being plotted on the abscissa.

The hot plate according to the third embodiment of the present invention is employed in a sputtering apparatus. Alternatively, it is also possible to employ the hot plate according to the third embodiment of the present invention in another semiconductor manufacturing apparatus such as a CVD apparatus, a RIE apparatus or a CDE (chemical dry etching) apparatus.

Figures 14, 15:
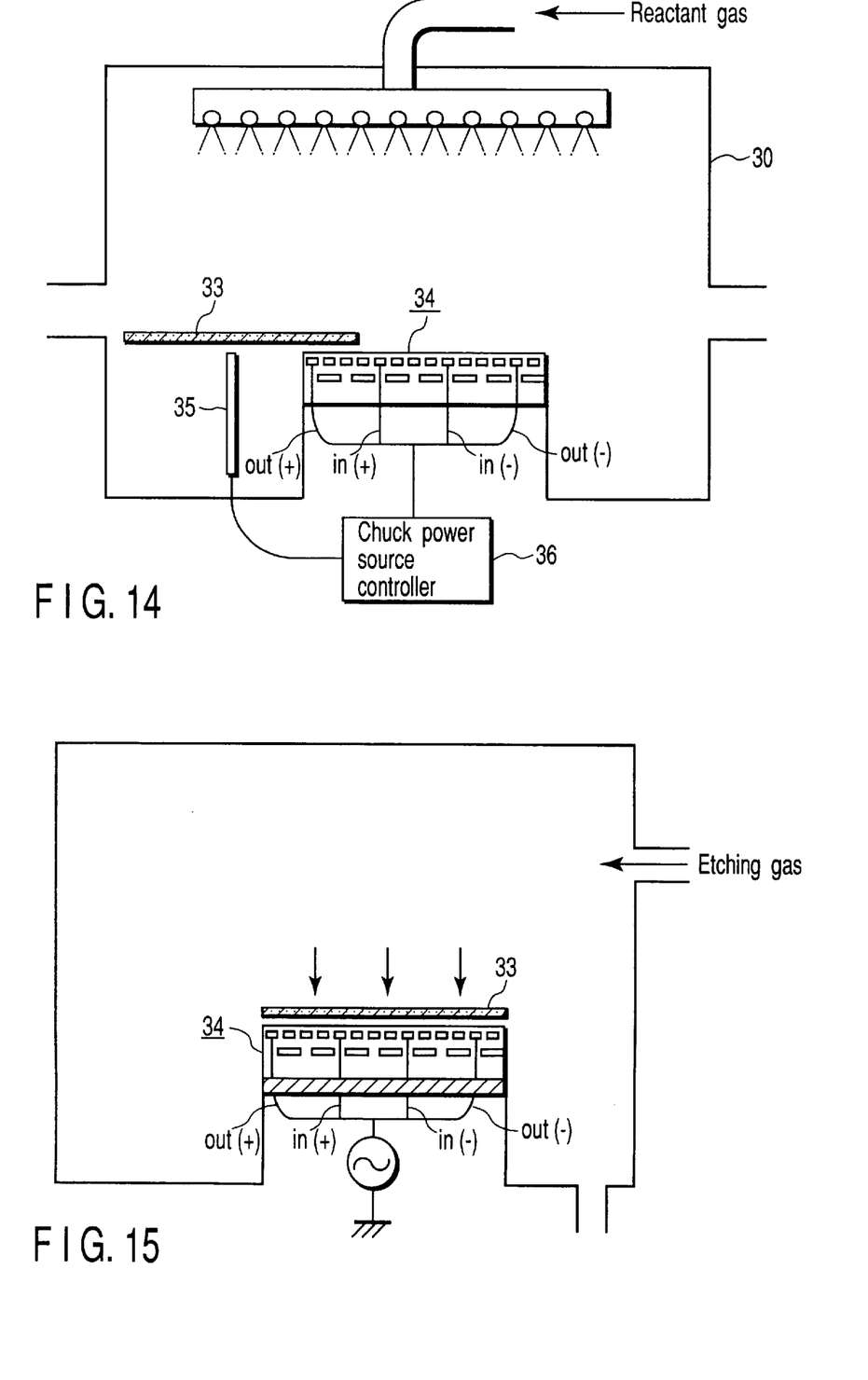
FIG. 14 is a cross sectional view schematically showing a CVD apparatus in which a hot plate is mounted, according to a fourth embodiment of the present invention.
FIG. 15 is a cross sectional view schematically showing a RIE type etching apparatus in which a hot plate is mounted, according to a fifth embodiment of the present invention.

FIG. 14 is a cross sectional view schematically showing that the hot plate is employed in a CVD apparatus.

In this modification, reactant gases such as silane and oxygen are supplied into a reaction chamber heated to 300° C. to 500° C. so as to form a silicon oxide film ($SiO_2$ film) by the oxidizing reaction on a silicon wafer disposed on the hot plate of the present invention.

A back surface monitor probe 35 for detecting the state of the back surface of a wafer 33 is arranged on the side of the stage on which the hot plate 34 is arranged. Before the wafer 33 is transferred so as to be disposed on the hot plate 34, the back surface state of the wafer 33 is monitored by the back surface monitor probe 35. The monitored information is supplied to the chuck power source controller 36 and, at the same time, the wafer 33 is disposed on the hot plate 34. Then, the chuck voltage applying parameter determined in advance on the basis of the back surface state is selected, and the inside chuck voltage and the outside chuck voltage are applied in the order mentioned. As a result, the wafer is chucked from the central portion of the wafer. A conventional hot plate may be used in place of the hot plate 34. Even in use of a conventional hot plate, by detecting the back surface state of the wafer 33 by the back surface monitor probe and controlling the parameters such as the chuck voltage, the chucking time, etc. the wafer is prevented from cracking, transfer error, etc.

Further, FIG. 15 is a cross sectional view schematically showing that the hot plate is arranged in a RIE type etching apparatus. In this modification, the hot plate of the present invention is arranged on the side of the cathode within the reaction chamber, and reactant gases of, for example, $CF_4$-$O_2$ (8 atomic %) are supplied into the reaction chamber. A high frequency voltage of 13.56 MHz is applied to the cathode so as to pattern a polycrystalline silicon (polysilicon) film formed on the silicon wafer disposed on the hot plate.

A back surface monitor probe for detecting the state of the back surface of a wafer 33 may be arranged on the side of the stage on which the hot plate 34 is arranged. Before the wafer 33 is transferred so as to be disposed on the hot plate 34, the back surface state of the wafer 33 is monitored by the back surface monitor probe. The monitored information is supplied to the chuck power source controller, not shown, and, at the same time, the wafer 33 is disposed on the hot plate 34. Then, the chuck voltage applying parameter determined in advance on the basis of the back surface state is selected, and the inside chuck voltage and the outside chuck voltage are applied in the order mentioned. As a result, the wafer is chucked from the central portion of the wafer. A conventional hot plate may be used in place of the hot plate 34. Even in use of a conventional hot plate, by detecting the back surface state of the wafer 33 by the back surface monitor probe and controlling the parameters such as the chuck voltage, the chucking time, etc. the wafer is prevented from cracking, transfer error, etc.

In the present invention, in chucking a semiconductor substrate to an electrostatic chuck type hot plate mounted to an apparatus for manufacturing a semiconductor apparatus such as an etching apparatus, a CVD apparatus or a sputtering apparatus, the chucking force is successively applied to the semiconductor substrate such that the chucking force is applied from the central portion toward the outer peripheral portion of the semiconductor substrate. For the particular operation, the electrostatic chuck electrode is divided into at least two portions in the radial direction of the electrostatic chuck electrode, i.e., into at least an inner circumferential electrode portion and an outer circumferential electrode portion, and the chuck voltage is applied successively from the inner circumferential region toward the outer circumferential region. Alternatively, in the present invention, the surface of the plate body of the hot plate on which a wafer (semiconductor substrate) is to be disposed is flat and the chucking electrode is provided in the plate body in a convex scheme over the range from one outer peripheral portion to the opposite outer peripheral portion of the plate body via the central portion so as to permit the chucking force to be applied from the central portion to the outer peripheral portion of the wafer. Alternatively, in the present invention, the surface of the plate body of the hot plate on which a wafer (semiconductor substrate) is to be disposed is flat and the chucking electrode and the heat generating electrode are provided in the plate body in a convex scheme over the range from one outer peripheral portion to the opposite outer peripheral portion of the plate body via the central portion so as to permit the chucking force to be applied from the central portion to the outer peripheral portion of the wafer. Moreover, alternatively, in the present invention, the surface of the plate body of the hot plate on which a wafer (semiconductor substrate) is to be disposed is curved downward from the central portion toward the outer peripheral portion such that the plate body has a convex cross sectional shape. In other words, the distance before the chucking between the wafer and the surface of the plate body is gradually increased from the central portion toward the outer peripheral portion so as to permit the chucking force to be applied from the central portion to the outer peripheral portion of the wafer.

In another aspect of the present invention, the back surface state of the wafer is monitored by using the back surface monitoring probe to detect the kind and thickness of the film formed on the wafer and, thus, to control the chuck voltage.

In the present invention, the chucking force is applied first to the central portion of the wafer so as to achieve the temperature elevation from the central portion of the wafer. It should be noted that the chucking force applied to the outer peripheral portion of the wafer is weak in the initial stage of the heating, with the result that the wafer is thermally expanded smoothly so as to weaken the stress generated in the wafer. It follows that it is possible to prevent the wafer from being broken. Also, the rubbing between the wafer and the hot plate is weak so as to suppress the particle generation. What should also be noted is that the voltage elevation and the discharge parameter, which are determined in advance by detecting in advance the back surface state of the wafer, are selected so as to automatically adjust the chucking force and the discharge time. It follows that it is possible to prevent the breakage and the erroneous transfer of the wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A hot plate comprising:
   a plate body having convex surface on which a semiconductor substrate is disposed;
   a heat generating electrode formed within the plate body; and
   an electrostatic chuck electrode formed in the plate body, wherein a distance between the semiconductor substrate and the convex surface of the plate body is increased from a central portion toward an outer peripheral portion of the plate body, when the semiconductor substrate is disposed on the convex surface of the plate body.

2. The hot plate according to claim 1, wherein the electrostatic chuck electrode is provided in a convex scheme over the range from one outer peripheral portion to the opposite outer peripheral portion of the plate body via the central portion.

3. The hot plate according to claim 2, wherein the heat generating electrode is provided in the same height in the plate body over the range from one outer peripheral portion to the opposite outer peripheral portion of the plate body via the central portion.

4. The hot plate according to claim 2, wherein the heat generating electrode is provided in a convex scheme over the range from one outer peripheral portion to the opposite outer peripheral portion of the plate body via the central portion.

5. A hot plate comprising:
   a plate body having a substantially flat surface on which a semiconductor substrate is disposed;
   a heat generating electrode formed within the plate body; and
   an electrostatic chuck electrode formed in a convex scheme in the plate body over the range from one outer peripheral portion to the opposite outer peripheral portion of the plate body via the central portion.

6. The hot plate according to claim 5, wherein the heat generating electrode is provided in the same height in the plate body over the range from one outer peripheral portion to the opposite outer peripheral portion of the plate body via the central portion.

7. The hot plate according to claim 5, wherein the heat generating electrode is provided in a convex scheme over the range from one outer peripheral portion to the opposite outer peripheral portion of the plate body via the central portion.

8. A method of manufacturing a semiconductor device, comprising:

disposing a semiconductor substrate on a hot plate including a plate body, a heat generating electrode formed in the plate body and configured to heat the semiconductor substrate disposed on the hot plate, and an electrostatic chuck electrode formed in the plate body and divided into a plurality of electrode portions over the range from one outer peripheral portion to the opposite outer peripheral portion of the plate body via the central portion to include an inner circumferential electrode portion and an outer circumferential electrode portion;

holding the semiconductor substrate on the hot plate by a chucking force generated by applying a chuck voltage to the electrostatic chuck electrode successively from the inner circumferential electrode portion toward the outer circumferential electrode portion to generate the chucking force successively from the inner circumferential electrode portion toward the outer circumferential electrode portion temperature; and processing the semiconductor substrate heated on the hot plate.

9. The method of manufacturing a semiconductor device according to claim 8, wherein the chuck voltage applied to the inner circumferential electrode portion has a substantially same value as that applied to the outer circumferential electrode portion.

10. The method of manufacturing a semiconductor device according to claim 8, wherein the chuck voltage applied to the inner circumferential electrode portion has a different value from that applied to the outer circumferential electrode portion.

11. The method of manufacturing a semiconductor device according to claim 8, wherein a voltage having a predetermined value is used as the chuck voltage applied to at least one of the electrode portions.

12. The method of manufacturing a semiconductor device according to claim 8, wherein the chuck voltage applied to at least one of the electrode portions is increased to a predetermined value while being changed.

13. The method of manufacturing a semiconductor device according to claim 8, further comprising detecting a back surface state of the semiconductor substrate before or after disposing the semiconductor substrate on the plate body, and controlling at least one of the chuck voltage and a chucking time based on a detected information.

14. The method of manufacturing a semiconductor device according to claim 8, further comprising releasing the semiconductor substrate from the hot plate by applying a chuck-releasing voltage of an opposite polarity to that of the chuck voltage to the electrode portions, after processing the semiconductor substrate on the plate body.

15. The method of manufacturing a semiconductor device according to claim 14, further comprising detecting a back surface state of the semiconductor substrate before or after disposing the semiconductor substrate on the plate body, and controlling at least one of the chuck-releasing voltage and a chuck-releasing time based on a detected information.

16. The method of manufacturing a semiconductor device according to claim 8, wherein the electrostatic chuck electrode comprises a pair of electrodes arranged in parallel in a spiral form, surrounding the central portion of the plate body, each of the electrodes being divided into portions including an inner circum-ferential electrode portion and an outer circumferential electrode portion.

17. The method of manufacturing a semiconductor device according to claim 8, wherein the electrostatic chuck electrode comprises ring-shape electrodes arranged in a concentric circle form, surrounding the central portion of the plate body.

18. The method of manufacturing a semiconductor device according to claim 8, wherein the electrostatic chuck electrode comprises circle-shape electrode patterns arranged to form concentric circles surrounding the central portion of the plate body.

19. The method of manufacturing a semiconductor device according to claim 8, wherein the electrostatic chuck electrode comprises combined comb-shape electrodes each comprising a pair of comb-shape patterns interlaced with each other, one of the comb-shape electrode being arranged in the central portion of the plate body and the other comb-shape electrodes surrounding the central portion of the plate body.

20. A method of manufacturing a semiconductor device, comprising:

disposing a semiconductor substrate on a hot plate including a plate body, a heat generating electrode formed in the plate body and configured to heat the semiconductor substrate disposed on the hot plate, and an electrostatic chuck electrode formed in the plate body;

holding the semiconductor substrate on the hot plate by a chucking force generated by applying a chuck voltage to the electrostatic chuck electrode;

processing the semiconductor substrate heated on the hot plate;

releasing the semiconductor substrate from the hot plate by applying a chuck-releasing voltage of an opposite polarity to that of the chuck voltage to the electrostatic chuck electrode; and controlling at least one of the chuck voltage, a chucking time, the chuck-releasing voltage, and a chuck-releasing time based on a detected information obtained by detecting a back surface state of the semiconductor substrate before or after disposing the semiconductor substrate on the plate body.

21. The hot plate according to claim 1, wherein the electrostatic chuck electrode is provided in the same height over the range from one outer peripheral portion to the opposite outer peripheral portion of the plate body via the central portion.

22. The hot plate according to claim 21, wherein the heat generating electrode is provided in the same height over the range from one outer peripheral portion to the opposite outer peripheral portion of the plate body via the central portion.

* * * * *

UNITED STATES PATENT AND TRADEMARK OFFICE
CERTIFICATE OF CORRECTION

PATENT NO.    : 6,500,686 B2
DATED         : December 31, 2002
INVENTOR(S)   : Katata et al.

It is certified that error appears in the above-identified patent and that said Letters Patent is hereby corrected as shown below:

Column 14,
Line 8, change "circum-ferential" to -- circumferential --.
Line 24, change "electrode" to -- electrodes --.

Signed and Sealed this

Fifteenth Day of April, 2003

JAMES E. ROGAN
*Director of the United States Patent and Trademark Office*